United States Patent
Cyrusian

(10) Patent No.: US 9,059,874 B2
(45) Date of Patent: Jun. 16, 2015

(54) SWITCHED CONTINUOUS TIME LINEAR EQUALIZER WITH INTEGRATED SAMPLER

(71) Applicant: Marvell World Trade Ltd., St. Michael (BB)

(72) Inventor: Sasan Cyrusian, Scotts Valley, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/962,900

(22) Filed: Aug. 8, 2013

(65) Prior Publication Data

US 2014/0050260 A1     Feb. 20, 2014

Related U.S. Application Data

(60) Provisional application No. 61/683,365, filed on Aug. 15, 2012.

(51) Int. Cl.
| | | |
|---|---|---|
| *H03H 7/30* | (2006.01) | |
| *H04L 27/01* | (2006.01) | |
| *H04L 25/03* | (2006.01) | |
| *H03F 3/45* | (2006.01) | |

(52) U.S. Cl.
CPC .......... *H04L 27/01* (2013.01); *H04L 25/03114* (2013.01); *H04L 25/03248* (2013.01); *H03F 3/45201* (2013.01); *H03F 2203/45494* (2013.01)

(58) Field of Classification Search
CPC .............. H04L 27/01; H04L 25/03114; H04L 25/03057; H04L 2025/0349; H04L 2025/03617; H04L 2025/03503; H04L 25/03038; H04L 25/03885; H04L 25/03159; H03F 3/45201; H03F 2203/45494
USPC .................................. 375/233, 232, 230, 229
See application file for complete search history.

(56) References Cited

U.S. PATENT DOCUMENTS

| | | | |
|---|---|---|---|
| 6,014,042 A * | 1/2000 | Nguyen | 327/3 |
| 2010/0046597 A1 * | 2/2010 | Farjad-rad | 375/232 |

OTHER PUBLICATIONS

Thomas Toifl et al., "A 2.6 mW/Gbps 12.5 Gbps RX With 8-Tap Switched-Capacitor DFE in 32 nm CMOS", IEEE Journal of Solid-State Circuits, Apr. 1, 2012, pp. 897-910, vol. 47, No. 4, Piscataway, NJ, USA.

Reid Riedlinger et al., "A 32 nm, 3.1 Billion Transistor, 12 Wide Issue ItaniumA TM Processor for Mission-Critical Servers", IEEE Journal of Solid-State Circuits, Jan. 1, 2012, pp. 177-193, vol. 47, No. 1, Piscataway, NJ, USA.

Balamurugan G et al., "Modeling and Analysis of High-Speed I/O Links", IEEE Transactions on Advanced Packaging, May 1, 2009, pp. 237-247, vol. 32, No. 1, Piscataway, NJ, USA.

International Search Report and Written Opinion for PCT/IB2013/001752, filed on Aug. 10, 2013.

* cited by examiner

*Primary Examiner* — Zewdu Kassa

(57) ABSTRACT

An apparatus includes an input, an output, an equalizer configured to receive an input signal at the input and to output an output signal for the output, and a reset block coupled to the equalizer and the output. The reset block is configured to pull the output signal at the output toward a bias voltage level based on a reset signal.

23 Claims, 14 Drawing Sheets

US 9,059,874 B2

SWITCHED CONTINUOUS TIME LINEAR EQUALIZER WITH INTEGRATED SAMPLER

CROSS REFERENCE TO RELATED APPLICATION

This present disclosure claims the benefit of U.S. Provisional Application No. 61/683,365, "SWITCHED CONTINUOUS TIME LINEAR EQUALIZER WITH INTEGRATED SAMPLER," filed on Aug. 15, 2012, which is incorporated by reference herein in its entirety.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

A communication channel is a signal path between a transmitter and a receiver, and a signal transmitted via the communication channel may be modified by noise, interference, and/or frequency-dependent attenuation. Frequency-dependent attenuation can introduce distortions into the transmitted signal including inter-symbol interference (ISI) and jitter. The presence of these distortions in the signal can produce errors in the reception of the signal at the receiver.

A communication channel can be implemented using differential signaling. Differential signaling can reduce the effects of some forms of interference, such as common mode noise.

Equalizers including Continuous Time Linear Equalizers (CTLEs) can be used in communication channels in order to compensate for the channel attenuation. A CTLE may be implemented as a differential amplifier with a fixed or programmable frequency dependent degeneration feature. In one example, a programmable frequency dependent degeneration feature is programmed by adjusting one or more resistance and/or capacitance values in the differential amplifier. These resistance and capacitance values may also define a "roll up point" which is the minimum frequency at which the differential amplifier will start to boost the output signal of the differential amplifier. A CTLE may be useful in other types of systems as well.

SUMMARY

In an embodiment of the disclosure, an apparatus includes an input, an output, an equalizer configured to receive an input signal at the input and to output an output signal for the output, and a reset block coupled to the equalizer and the output. The reset block is configured to pull the output signal at the output toward a bias voltage level based on a reset signal.

In an embodiment of the disclosure, a method performs equalization of a communication signal in order to compensate for channel frequency attenuation that may occur in the communication signal. The method includes: receiving an input voltage at an input and outputting an output voltage at an output; and pulling the output voltage at the output toward a bias voltage level based on a reset signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
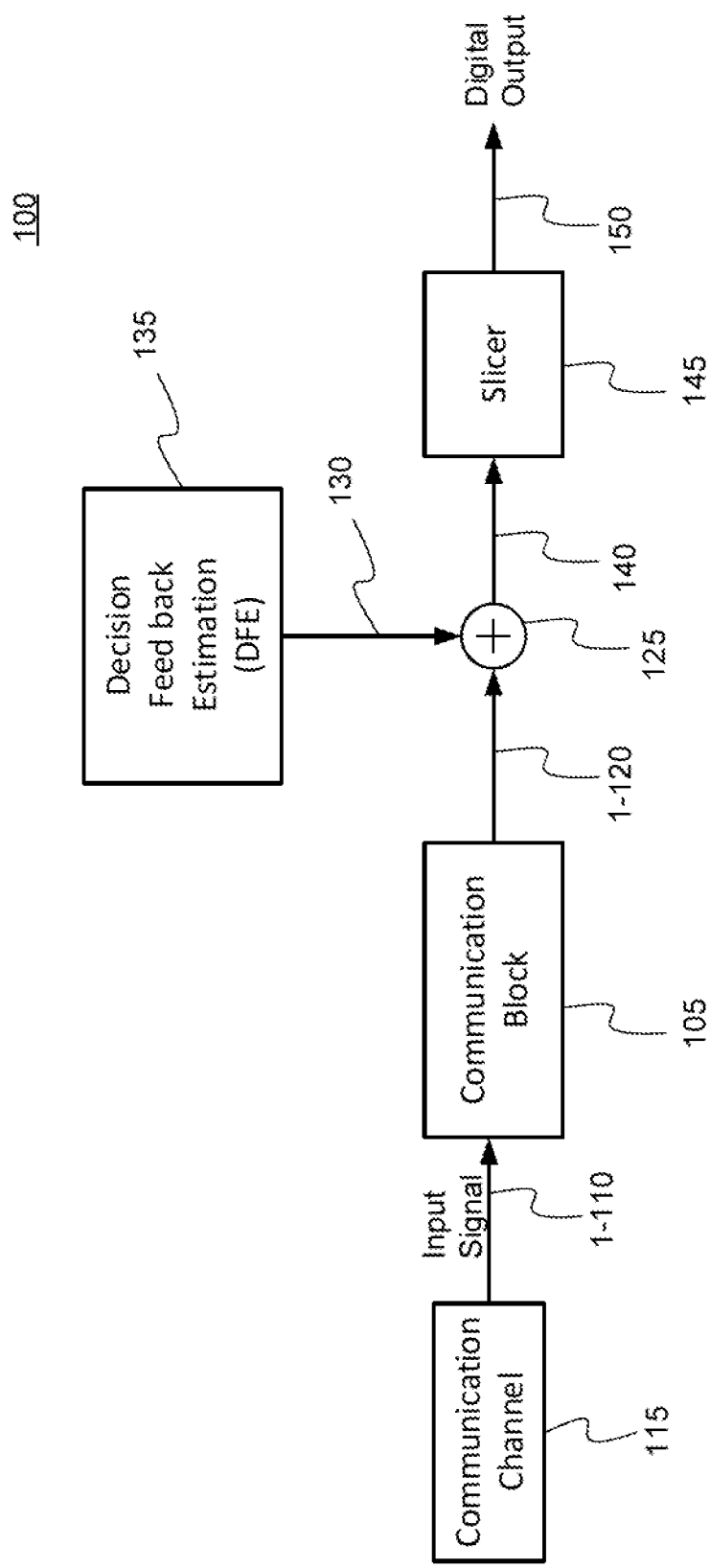
FIG. 1 is a block diagram of a receiver path having a communication block, in accordance with an embodiment of the disclosure.

FIG. 1 is a block diagram of a receiver path 100 with a communication block 105, in accordance with an embodiment of the disclosure. The receiver path 100 may be used in a serial data receiver. The communication block 105 may be, for example, a switched continuous time linear equalizer (CTLE) or a switched CTLE with an integrated sampler, as will be discussed below in various embodiments of the disclosure. The communication block 105 may also be included or used in other systems that are different from serial data receivers.

The communication block 105 receives an input communication signal 1-110 via a communication channel 115 and generates an output communication signal 1-120. The block 105 performs equalization on the input signal 1-110 to generate the output signal 1-120. In an embodiment, input communication signal 1-110 and/or output communication signal 1-120 are differential signals. In an embodiment, input communication signal 1-110 and/or output communication signal 1-120 operate by varying a voltage or a current.

The input communication signal 1-110 received from the communication channel 115 may include attenuation including frequency dependent attenuation. For example, the frequency dependent attenuation due to the skin effect and dielectric loss, which are two possible sources of attenuation in the communication channel 115, is proportional to a square root of a frequency and the frequency, respectively. In an embodiment of the disclosure, the communication block 105 compensates for the attenuation including frequency dependent attenuation that is present in input communication signal 1-110 to produce output communication signal 1-120. Additional details of elements and operations of the communication block 105 in various embodiments will be described further below.

In an embodiment of the disclosure, the receiver path 100 may also include a summing node 125 that processes the output communication signal 1-120 and a signal 130 that is generated by a Decision Feedback Estimation (DFE) block 135. In another embodiment of the disclosure, the summing node 125 and the DFE block 135 are omitted in the receiver path 100, and the communication block 150 is instead connected to the slicer 145.

By way of example and not by way of limitation, in an embodiment where the communication block 105 is connected to the summing node 125, the function of the summing node 125 will be to add or subtract one or more signals from the output communication signal 1-120. The summing node 125 generates an output value 140, and the slicer 145 reads the output value 140 and determines a digital value that corresponds to the input communication signal 1-110. As a result, the slicer 145 will generate a digital output 150 that is, for example, a digital high (e.g., "1") or a digital low (e.g., "0"). In an embodiment, the slicer 145 determines a multi-bit digital value that corresponds to the input communication signal 1-110 and generates a corresponding multi-bit digital output 150.

Figure 2:
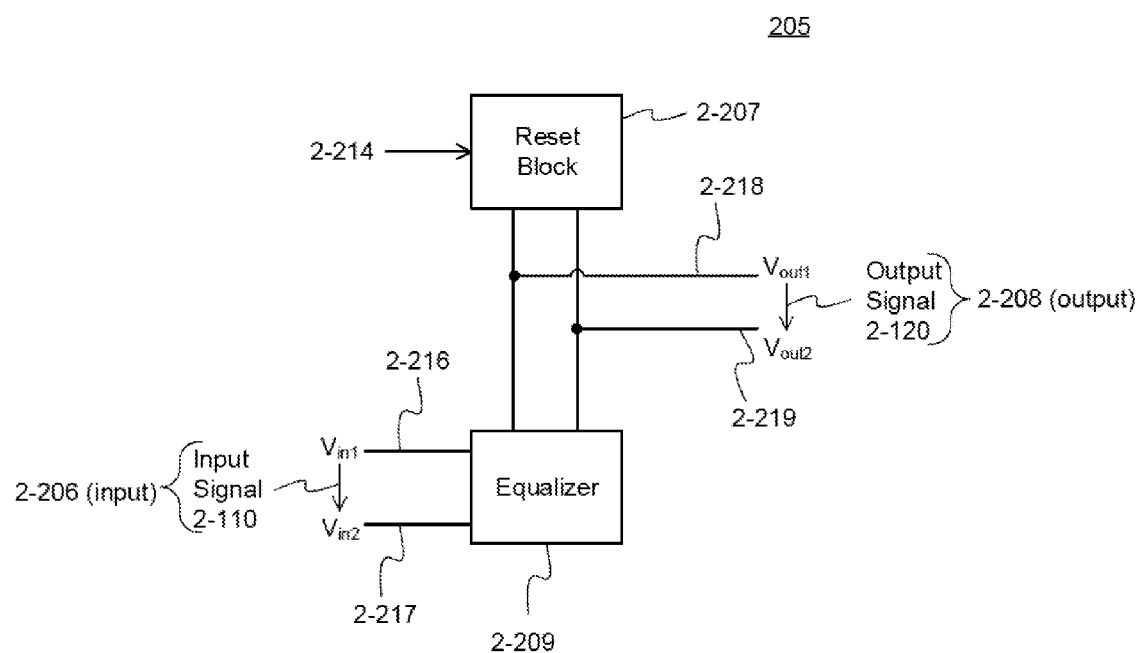
FIG. 2 is a block diagram of a communication block that includes an equalizer, in accordance with an embodiment of the disclosure.

FIG. 2 is a block diagram of a communication block 205 that includes a reset block 2-207 and an equalizer 2-209 that is connected to the reset block 2-207, in accordance with an embodiment of the disclosure. In an embodiment, the equalizer 2-209 is a CTLE. The equalizer 2-209 has an input 2-206 and an output 2-208. The equalizer 2-209 is configured to receive an input signal 2-110 at the input 2-206. The equalizer 2-209 is configured to output an output signal 2-120 at the output 2-208.

The reset block 2-207 is coupled to the equalizer 2-209 and is configured to periodically reset the output signal 2-120 at the output 2-208 based on a reset signal 2-214. In an embodiment of the disclosure, the reset block 2-207 is configured to receive the reset signal 2-214 for controlling the switching function of the reset block 2-207.

In an embodiment of the disclosure, the equalizer 2-209 may include a differential amplifier. The input signal 2-110 may be a differential input signal including first and second input differential voltage signals $V_{in1}$ and $V_{in2}$ that are transmitted through first and second input differential signal paths 2-216 and 2-217, respectively. The equalizer 2-209 may generate an output signal 2-120 that is a differential output voltage via first and second output differential signal paths 2-218 and 2-219. The output signal 2-120 including a first output differential voltage $V_{out1}$ output via the first output differential signal path 2-218 and a second output differential voltage $V_{out2}$ output via the second output differential voltage path 2-219.

In an embodiment of the disclosure, the equalizer 2-209 and the reset block 2-207 are combined in the communication block 205 so that this configuration in the communication block 205 will change the continuous time amplifier behavior of the equalizer 2-209 into a switched amplifier behavior.

Figure 3:
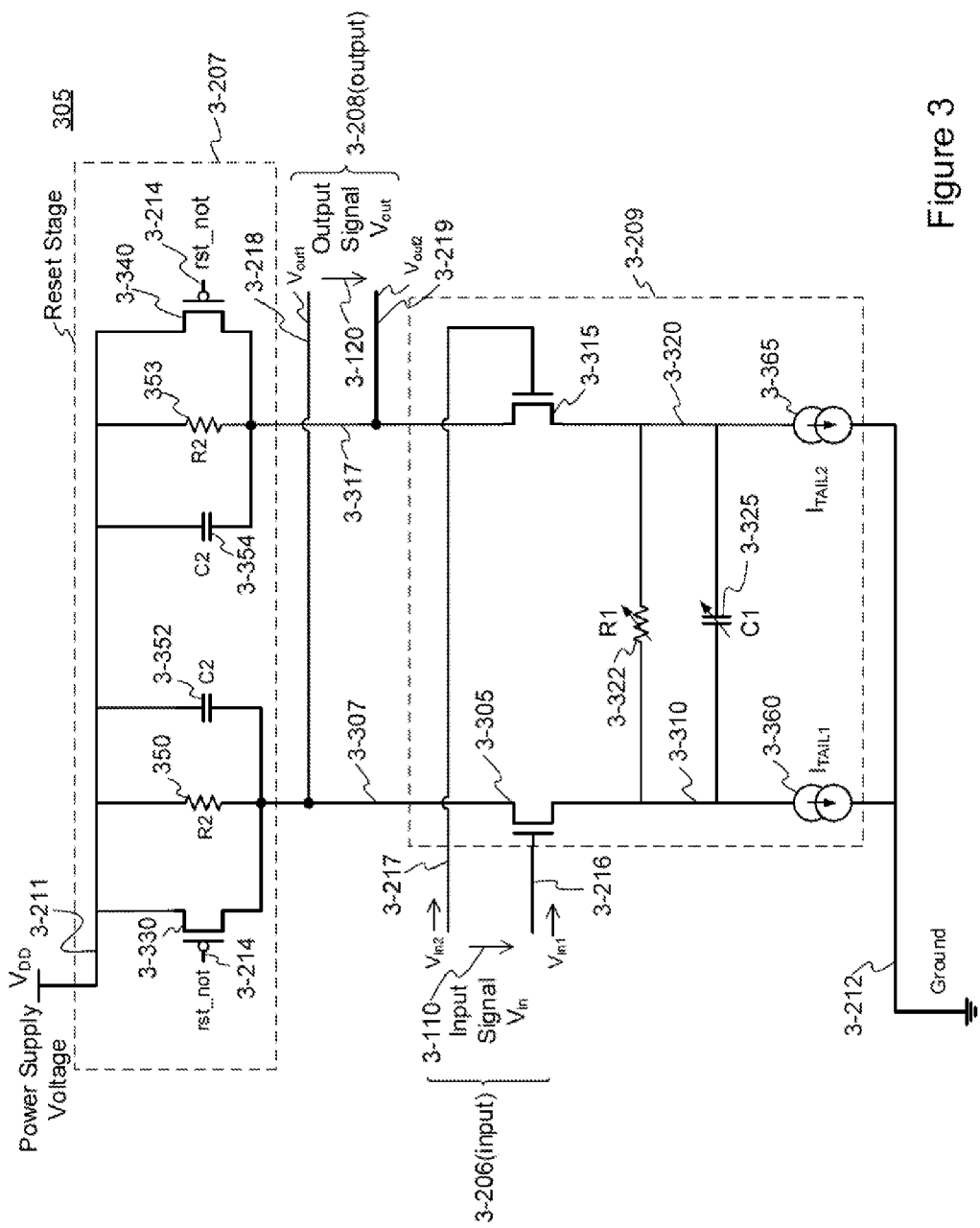
FIG. 3 is a diagram of a communication block, in accordance with an embodiment of the disclosure.

FIG. 3 is a diagram of a communication block 305 that includes a reset block 3-207 and an equalizer 3-209 that is connected to the reset block 3-207, in accordance with an embodiment of the disclosure. While an example of the particular details of the reset block 3-207 and the equalizer 3-209 will now be discussed, it is noted that other components and/or configurations may also be used for the reset block 3-207 and/or equalizer 3-209 in order to perform the functionalities in accordance with an embodiment of the disclosure.

In an embodiment, the equalizer 3-209 has a first active device 3-305 with an input connected to the first differential input voltage path 3-216, and two output terminals connected to a first electrical path 3-307 and a second electrical path 3-310. In an embodiment, the first active device 3-305 is or includes a transistor having a gate or base connected to the first differential input voltage path 3-216.

The equalizer 3-209 also has a second active device 3-315 with an input connected to the second differential input voltage path 3-217, and two output terminals connected to a third electrical path 3-317 and a fourth electrical path 3-320. In an embodiment, the second active device 3-315 is or includes a transistor having a gate or base connected to the second differential input voltage path 3-217.

The output signal 3-120 of the equalizer includes a first output voltage signal $V_{out1}$ that is generated on a first output differential voltage path 3-218 and a second output voltage signal $V_{out2}$ that is generated on a second output differential voltage path 3-219. In an embodiment, a value of the output signal 3-120 is proportional to the difference between $V_{out1}$ and $V_{out2}$.

The equalizer 3-209 has a resistor 3-322 and a capacitor 3-325 connected in parallel between electrical paths 3-310 and 3-320. The resistor 3-322 may be a variable resistor including an electronically-controlled circuit having a variable resistance. The capacitor 3-325 may be a variable capacitor including an electronically-controlled circuit having a variable capacitance. The resistance and capacitance values of the resistor 3-322 and the capacitor 3-325, respectively, define the "roll up point," which is the frequency at which the equalizer 3-209 will start to boost the output signal 3-120 of the equalizer 3-209.

In an embodiment, any or each of the active devices 3-305 and 3-315 is an n-MOS transistor. When the active device 3-305 is an n-MOS transistor, the n-MOS transistor 3-305 has a drain connected to the first electrical path 3-307 and a source connected to the second electrical path 3-310. When the active device 3-315 is an n-MOS transistor, the n-MOS transistor 3-315 has a drain connected to the third electrical path 3-317 and a source connected to the fourth electrical path 3-320. In another embodiment, any or each of the active devices 3-305 and 3-315 can be another type of transistor or another type of device having current gain and three terminals.

In an embodiment, a reset block 3-207 integrated with an equalizer 3-309 in a communication block 305 includes a third active device 3-330, which functions as a first reset switch. The third active device 3-330 has an input that is configured to receive the reset signal 3-214 and two output terminals connected to the power supply voltage 3-211 and to the first electrical path 3-307. In an embodiment, the third active device 3-330 is a transistor having a gate or base that is configured to receive the reset signal 3-214.

The reset block 3-207 has a fourth active device 3-340, which functions as a second reset switch, with an input that is configured to receive the reset signal 3-214 and with two output terminals connected to the power supply voltage 3-211 and to the second electrical path 3-317. In an embodiment, the fourth active device 3-340 is a transistor having a gate or base that is configured to receive the reset signal 3-214.

In an embodiment, any or each of the active devices 3-330 and 3-340 is a p-MOS transistor. When the third active device 3-330 is a p-MOS transistor, the p-MOS transistor has a drain connected to the first electrical path 3-307 and a source connected to the power supply voltage 3-211. When the fourth active device 3-340 is a p-MOS transistor, the p-MOS transistor 3-340 has a drain connected to the second electrical path 3-317 and a source connected to the power supply voltage 3-211. In this embodiment, when the reset signal 3-214 is low, the active devices 3-330 and 3-340 will turn on, and when the reset signal 3-214 is high, the active devices 3-330 and 3-340 will turn off. In yet another embodiment, any or each of the active devices 3-330 and 3-340 can be another type of transistor or another type of switching element. In another embodiment, the active devices 3-330 and 3-340 may turn on when the reset signal 3-214 is high and turn off when the reset signal 3-214 is low.

The differential output voltage paths 3-218 and 3-219 transmit the differential output voltage signals $V_{out1}$ and $V_{out2}$, respectively. The first differential output voltage path 3-218 and second differential output voltage path 3-219 are connected to the first electrical path 3-307 and the second electrical path 3-317, respectively.

A first load resistor 350 and a first load capacitor 3-352 are connected to the output terminals of the third active device 3-330. The first load resistor 350, the first load capacitor 3-352, and the third active device 3-330 are connected in parallel, i.e. the first and second outputs (the switched terminals) of the third active device 3-330 are connected to opposite sides of each of the first load resistor 350 and the first load capacitor 3-352. In an embodiment where the active device 3-330 is a MOS transistor, the first load resistor 350 and first load capacitor 3-352 are connected to the source and drain of the MOS transistor 3-330.

A second load resistor 353 and a second load capacitor 3-354 are connected to the output terminals of the fourth active device 3-340. Therefore, the second load resistor 353, the second load capacitor 3-354, and the fourth active device 3-340 are connected in parallel, i.e. the first and second outputs (the switched terminals) of the fourth active device 3-340 are connected to opposite sides of each of the second load resistor 353 and the second load capacitor 3-354. In an embodiment where the active device 3-340 is a MOS transistor, the second load resistor 353 and second load capacitor 3-354 are connected to the source and drain of the MOS transistor 3-340.

The capacitance values of each of the load capacitors 3-352 and 3-354 may represent the parasitic capacitances in the circuitry of the reset block 3-207 and/or a capacitance of circuitry that is outside the communication block 305 and that is connected to the first and/or second differential output voltage paths 3-218 and/or 3-219. Similarly, the values of each of the load resistors 350 and 353 may represent a resistance corresponding to leakage currents in the circuitry of the reset block 3-207 and/or a resistance of circuitry that is outside the communication block 305 and that is connected to the first and/or second differential output voltage paths 3-218 and/or 3-219. The resistance values of the load resistors 350 and 353 may be programmable values.

In an embodiment of the reset block 3-207, the resistance value of at least one of the load resistors 350 and/or 353 is set to a value comparable or larger than the effective output resistance of the circuit including the active devices 3-330/3-305 and 3-340/3-315 and the load circuit connected to 3-307 and 3-317. When the resistances of resistors 350 and 353 are sufficiently large, the resistors 350 and 353 may be omitted in FIG. 3 and the resistance values may be considered substantially infinite.

When the resistors 350 and 353 are omitted, the first and second differential output voltages $V_{out1}$ and $V_{out2}$ change in a substantially linear manner when active devices 3-330 and 3-340 are turned off. On the other hand, when the communication block 305 has the load resistors 350 and 353 with lower resistances, the first and second differential output voltages $V_{out1}$ and $V_{out2}$ change so as to exponentially approach a limiting value.

A first tail current $I_{tail1}$ controlled by a first current source 3-360 of the active device 3-305 flows to ground 3-212 through the second electrical path 3-310. A second tail current $I_{tail2}$ controlled by a second current source 3-365 of the active device 3-315 flows to ground 3-212 through the fourth electrical path 3-320. In an embodiment, first and second current sources 3-360 and 3-365 operate so that the first tail current $I_{tail1}$ has approximately the same magnitude and direction as that of the second tail current $I_{tail2}$, and may be referred to as the first and second constant current sources 3-360 and 3-365.

Figure 4:
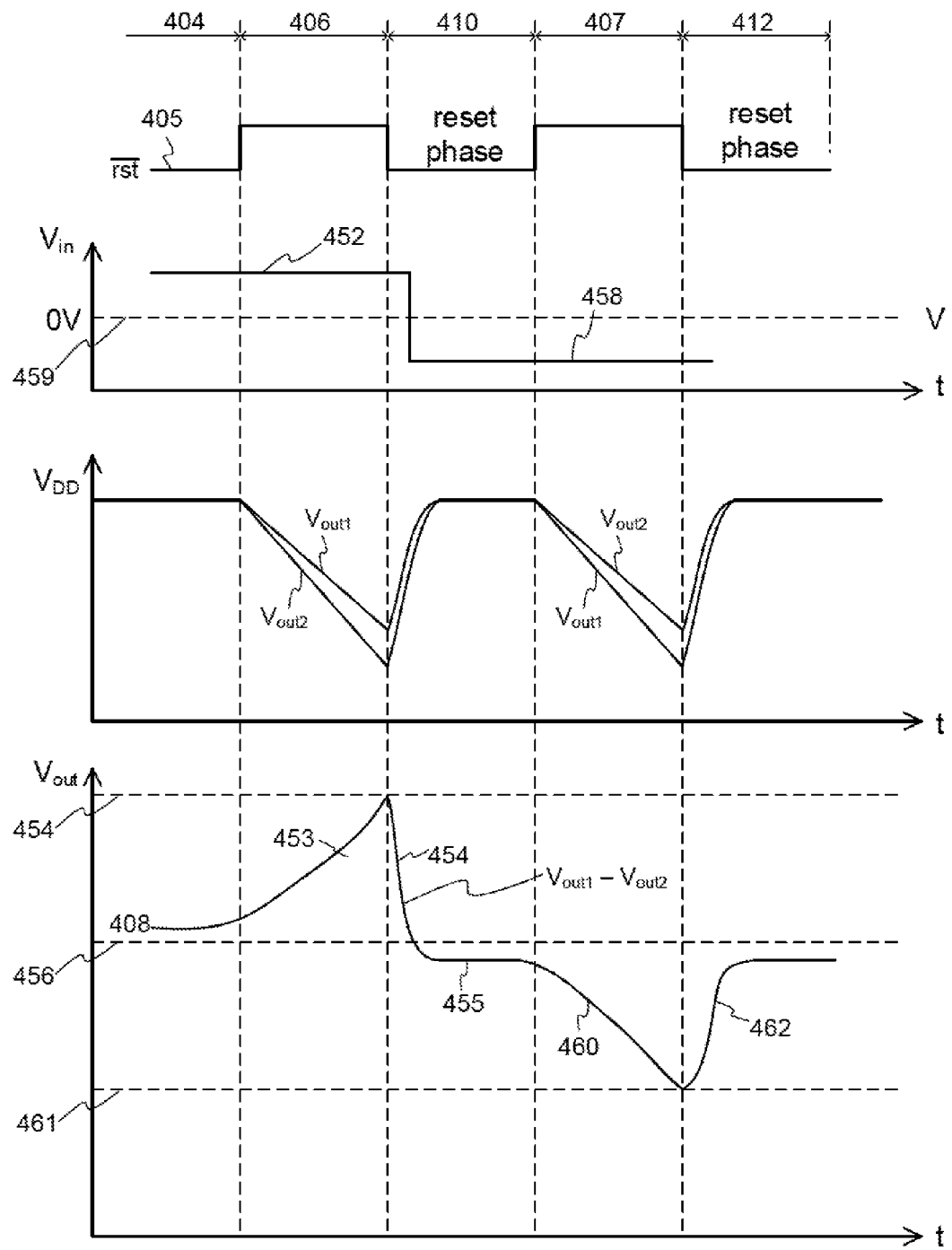
FIG. 4 are waveform diagrams of signals relating to the communication block of FIG. 3.

FIG. 4 shows waveform diagrams of signals relating to the communication block 305 of FIG. 3, in accordance with an embodiment of the disclosure. A waveform 405 represents the reset signal 3-214. A waveform 408 represents the output voltage signal 3-120, which corresponds to the value of $V_{out1}-V_{out2}$. A waveform 452 represents the input voltage signal $V_{in}$, which corresponds to the value of $V_{in2}-V_{in1}$.

The waveform (or the reset signal waveform) 405 representing the reset signal 3-214 (FIG. 3) is low during a time interval 404, permitting the reset block 3-207 to perform a switching function. The reset block 3-207 pulls both differential output voltage signals $V_{out1}$ and $V_{out2}$ at the output 3-208 of the communication block 305 toward a bias voltage level (e.g., power supply voltage VDD). As a result, the waveform (or output signal waveform) 408 representing the output signal $V_{out}$ becomes close to the zero voltage level 456. The reset signal 3-214 is termed "asserted" when it is at a value that causes the reset unit to pull the differential output voltage signals $V_{out1}$ and $V_{out2}$, and termed "de-asserted" when it is not at such a value.

During a time interval 406, the reset signal waveform 405 is high (i.e., the reset signal 3-214 is de-asserted) and the input voltage $V_{in}$ is high at a waveform portion 452 (above a zero voltage reference level 459). Accordingly, the first input differential voltage signal $V_{in1}$ is smaller than the second input differential voltage signal $V_{in2}$. Because the first input differential voltage signal $V_{in1}$ is smaller than the second input differential voltage signal $V_{in2}$, a smaller current flows through the first active device 3-305 than flows through the second active device 3-315. As a result, both the first and second differential output voltages $V_{out1}$ and $V_{out2}$ decrease, and the first differential voltage output $V_{out1}$ decreases at a slower rate than the second differential voltage output $V_{out2}$ so that the output signal waveform 408 representing the output signal $V_{out}$ (i.e., $V_{out1}-V_{out2}$) increases along a waveform portion 453 toward a voltage level line 454.

During a time interval 410, the reset signal waveform 405 goes low during the reset phase, which turns on the active devices 3-330 and 3-340. The active devices 3-330 and 3-340 pull the voltages $V_{out1}$ and $V_{out2}$, respectively, toward the power supply voltage level VDD. Therefore, the waveform 408 representing the difference between $V_{out1}$ and $V_{out2}$ decreases along a waveform portion 454 and becomes close to a zero voltage level 456.

During a time interval 407, the reset signal waveform 405 is high and the input voltage $V_{in}$ is low at a waveform portion 458 (below the zero voltage reference level 459). Accordingly, the first input differential voltage signal $V_{in1}$ will be larger than the second input differential voltage signal $V_{in2}$, and therefore a larger current flows through the first active device 3-305 than through the second active device 3-315. As a result, the first differential voltage output $V_{out1}$ decreases at a faster rate than the second differential voltage output $V_{out2}$ so that the output signal waveform 408 (i.e., $V_{out1}-V_{out2}$) decreases further along a waveform portion 460 to the voltage level line 461.

During a time interval 412, the reset signal waveform 405 goes low during the reset phase, which turns on the active devices 3-330 and 3-340. Accordingly, the active devices 3-330 and 3-340 pull the voltages $V_{out1}$ and $V_{out2}$, respectively, toward the power supply voltage level VDD. Since the difference between $V_{out1}$ and $V_{out2}$ decreases during the reset phase, the output signal waveform 408 approaches close to the zero voltage level 456.

Figure 5:
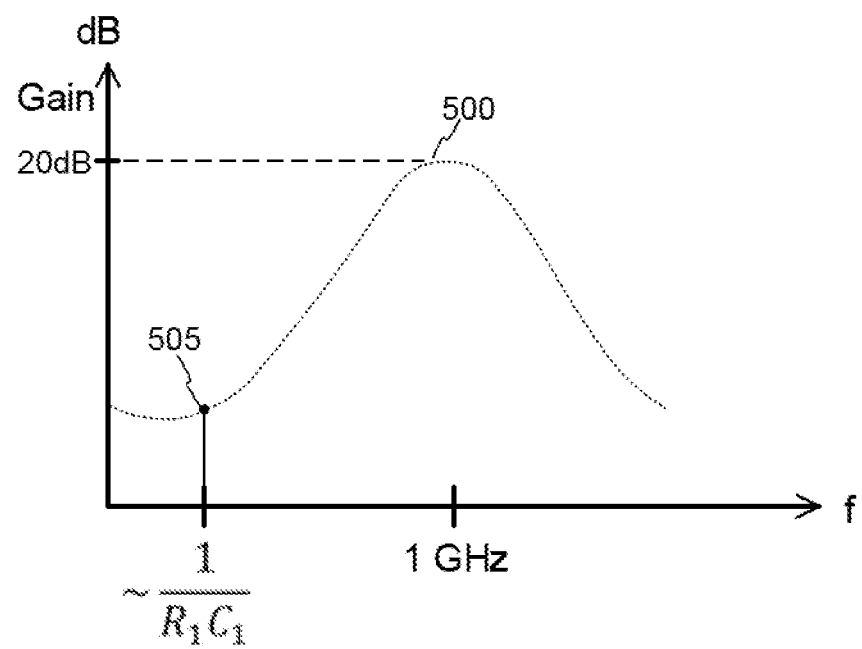
FIG. 5 is a waveform showing gain versus frequency values relating to the communication block of FIG. 3.

FIG. 5 is a waveform 500 showing gain (dB) versus frequency values relating to the communication block 305 of FIG. 3, in accordance with an embodiment of the disclosure. The waveform 500 shows that the equalizer 3-209 is configured to amplify different frequency components of the input voltage 3-110 with different gains in order to produce the output signal 3-120. As an example, the waveform 500 shows the equalizer 3-209 providing a boost of 20 dB to components of the input voltage 3-110 that have a frequency of approximately 1 GHz. The frequency at which a gain boost starts to occur (the "roll up point" 505) is inversely proportional to a value (R1*C1), wherein R1 is a resistance value of the resistor 3-322 and C1 is a capacitance value of the capacitor 3-325. Thus, it is possible to adjust a bandwidth of the gain boost by varying the resistance value R1 and/or the capacitance value C1.

Figure 6:
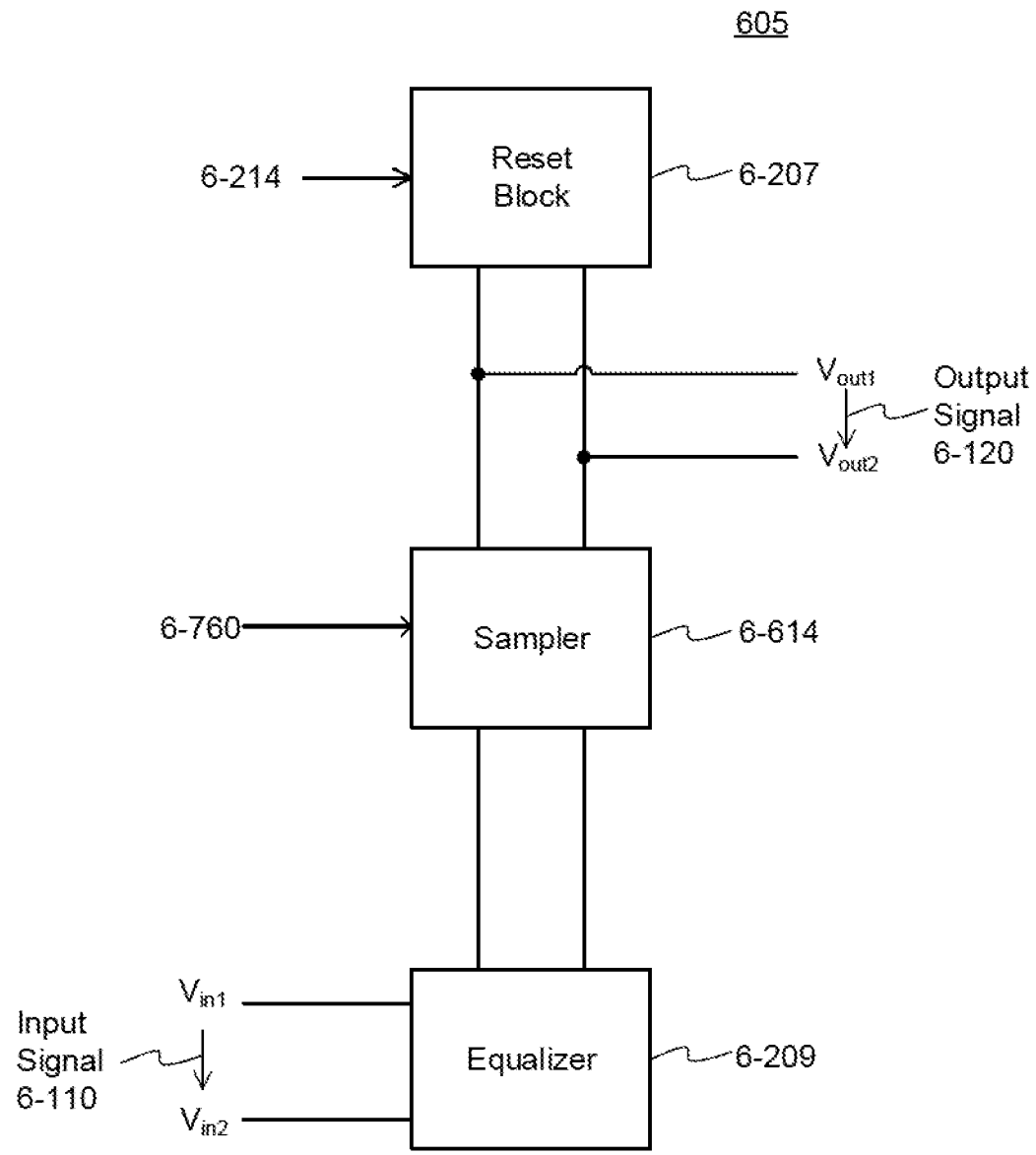
FIG. 6 is a block diagram of a communication block, in accordance with an embodiment of the disclosure.

FIG. 6 is a block diagram of a communication block 605, in accordance with an embodiment of the disclosure. The communication block 605 includes a reset block 6-207, an equalizer 6-209, and a sampler block 6-614 that is coupled to the reset block 6-207 and the equalizer 6-209. The sampler block 6-614 is configured to connect and disconnect the reset block 6-207 with the equalizer 6-209 according to the value of sample signal 6-760. The operations of the reset block 6-207 and the equalizer 6-209 were similarly described above with respect to the reset block 2-207 and the equalizer 2-209, respectively, with reference to FIG. 2.

Figure 7:
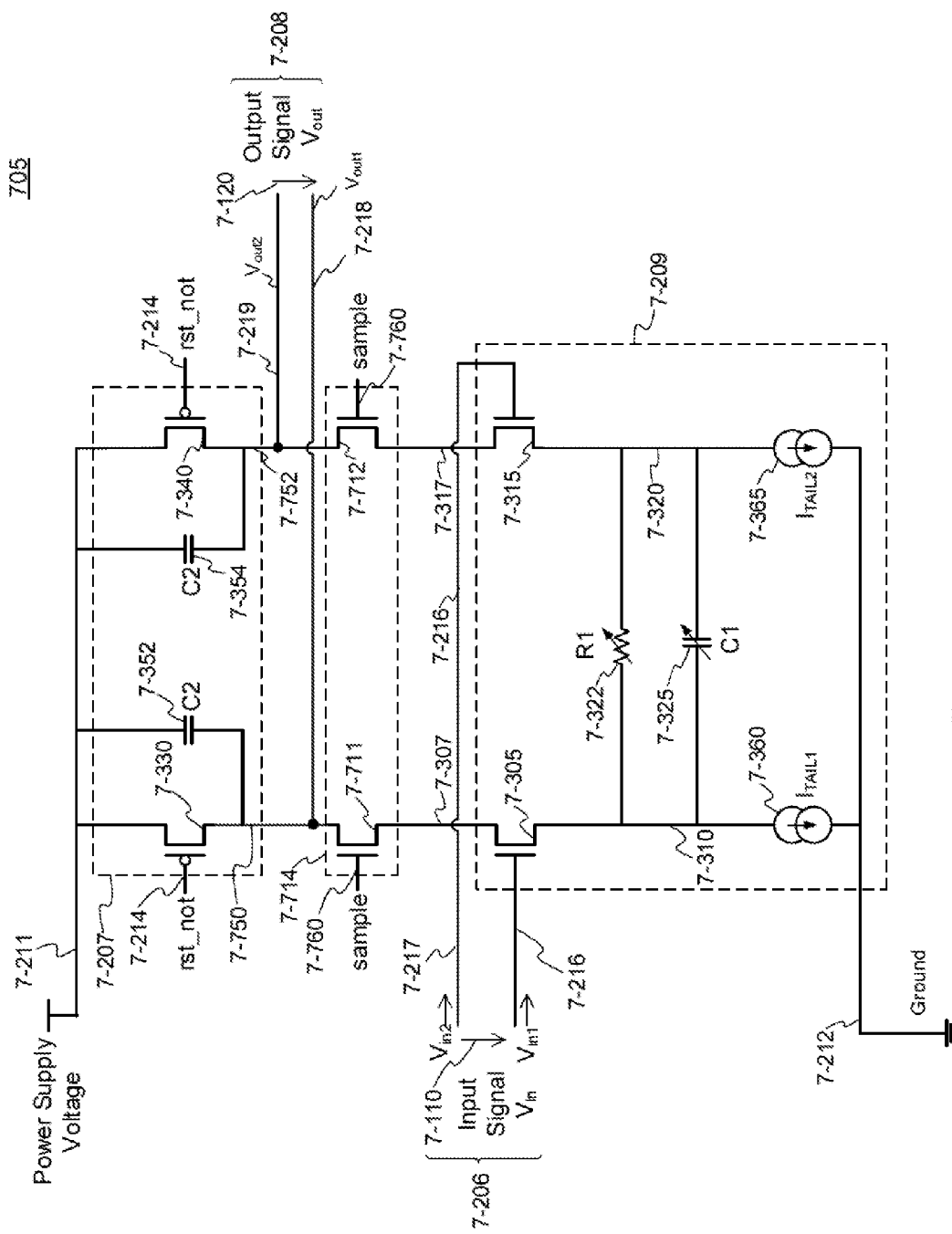
FIG. 7 is a diagram of a communication block, in accordance with an embodiment of the disclosure.

FIG. 7 is a diagram of a communication block 705, in accordance with an embodiment of the disclosure. The communication block 705 includes a reset block 7-207, an equalizer 7-209, and a sampler block 7-714 that is coupled to the reset block 7-207 and the equalizer 7-209. The reset block 7-207 and the equalizer 7-209, respectively, have similar components and configuration to those described for the reset block 3-207 and the equalizer 3-209 in FIG. 3. Some of the differences between the reset block 7-207 and the reset block 3-207 are described below. The sampler block 7-714 is configured to connect and disconnect the reset block 7-207 with the equalizer 7-209. While an example of the particular details of the reset block 7-207, equalizer 7-209, and sampler block 7-714 will now be discussed, it is noted that other components and/or configurations may also be used for the reset block 7-207, equalizer 7-209, and/or sampler block 7-714 in order to perform the functionalities in accordance with this embodiment of the disclosure.

The sampler block 7-714 is connected via a fifth electrical path 7-750 and a sixth electrical path 7-752 to the reset block 7-207. The sampler block 7-714 is connected via a first electrical path 7-307 and a third electrical path 7-317 to the equalizer 7-209.

The sampler block 7-714 includes a first sampling device (e.g., sampling switch) 7-711 and a second sampling device (e.g., sampling switch) 7-712. The first sampling switch 7-711 of the sampler block 7-714 is configured to connect and disconnect a first reset active device 7-330 (e.g., reset switch) of the reset block 7-207 with the equalizer 7-209. The second sampling switch 7-712 of the sampler block 7-714 is configured to connect and disconnect a second reset active device 7-340 (e.g., reset switch) of the reset block 7-207 with the equalizer 7-209. Additionally or alternatively, in an embodiment of the block 705, the first sampling switch 7-711 and the second sampling switch 7-712 may alternatively connect and disconnect the first reset active device 7-330 and the second reset active device 7-340 of the reset block 7-207 with the equalizer 7-209, respectively.

In an embodiment of the communication block 705, the first sampling switch 7-711 and the second sampling switch 7-712 are connected to the equalizer 7-209 and to the reset block 7-207. The first sampling switch 7-711 and the second sampling switch 7-712 are also connected to the output 7-208 of the communication block 705.

In an embodiment of the sampler block 7-714, the switches 7-711 and 7-712 can be or can include, for example, transistors 7-711 and 7-712. In an embodiment, any or each of the switches 7-711 and 7-712 can be or can include an n-MOS transistor. In another embodiment, any or each of the switches 7-711 and 7-712 can be another type of transistor or another type of switching element.

In an embodiment, the first sampling switch 7-711 of the sampler block 7-714 has an input that is configured to receive a sample signal 7-760. First and second switched terminals of the first sampling switch 7-711 are connected to the reset block 7-207 and the equalizer 7-209 via the fifth electrical path 7-750 and the first electrical path 7-307, respectively. Similarly, the second sampling switch 7-712 has an input that is configured to receive the sample signal 7-760. First and second switched terminals of the second sampling switch 7-712 are connected to the reset block 7-207 and the equalizer 7-209 via the sixth electrical path 7-752 and the second electrical path 7-317, respectively. The sample signal 7-760 is configured to switch the sampler block 7-714 to an on state and an off state. In particular, the sample signal 7-760 will turn the sampling switches 7-711 and 7-712 to an on state or an off state, depending on the value of the sample signal 7-760. Generally, the sample signal 7-760 is termed "asserted" when it turns the sampling switches 7-711 and 7-712 on and termed "de-asserted" when it turns off the sampling switches 7-711 and 7-712.

The first output differential voltage path 7-218 and the second output differential voltage path 7-219 output the first output differential voltage $V_{out1}$ and the second output differential voltage $V_{out2}$, respectively. The first and second output differential voltage paths are coupled to the equalizer 7-209 through the sampler block 7-714.

The first and second differential voltages $V_{in1}$ and $V_{in2}$ are transmitted via the first and second input differential voltage paths 7-216 and 7-217, both of which are coupled to the equalizer 7-209. For example, the first and second input differential voltage paths 7-216 and 7-217 are applied to gates of the first active device 7-305 and the second active device 7-315 of the equalizer 7-209, respectively. The first output differential voltage path 7-218 is connected to the fifth electrical path 7-750 and the second output differential voltage path 7-219 is connected to the sixth electrical path 7-752.

Other components and/or configurations may be used for the sampler block 7-714 and/or for other blocks (e.g., the reset block 7-207 and the equalizer 7-209) in the communication block 705 in order to perform the functionalities in accordance with an embodiment of the disclosure.

Figure 8:
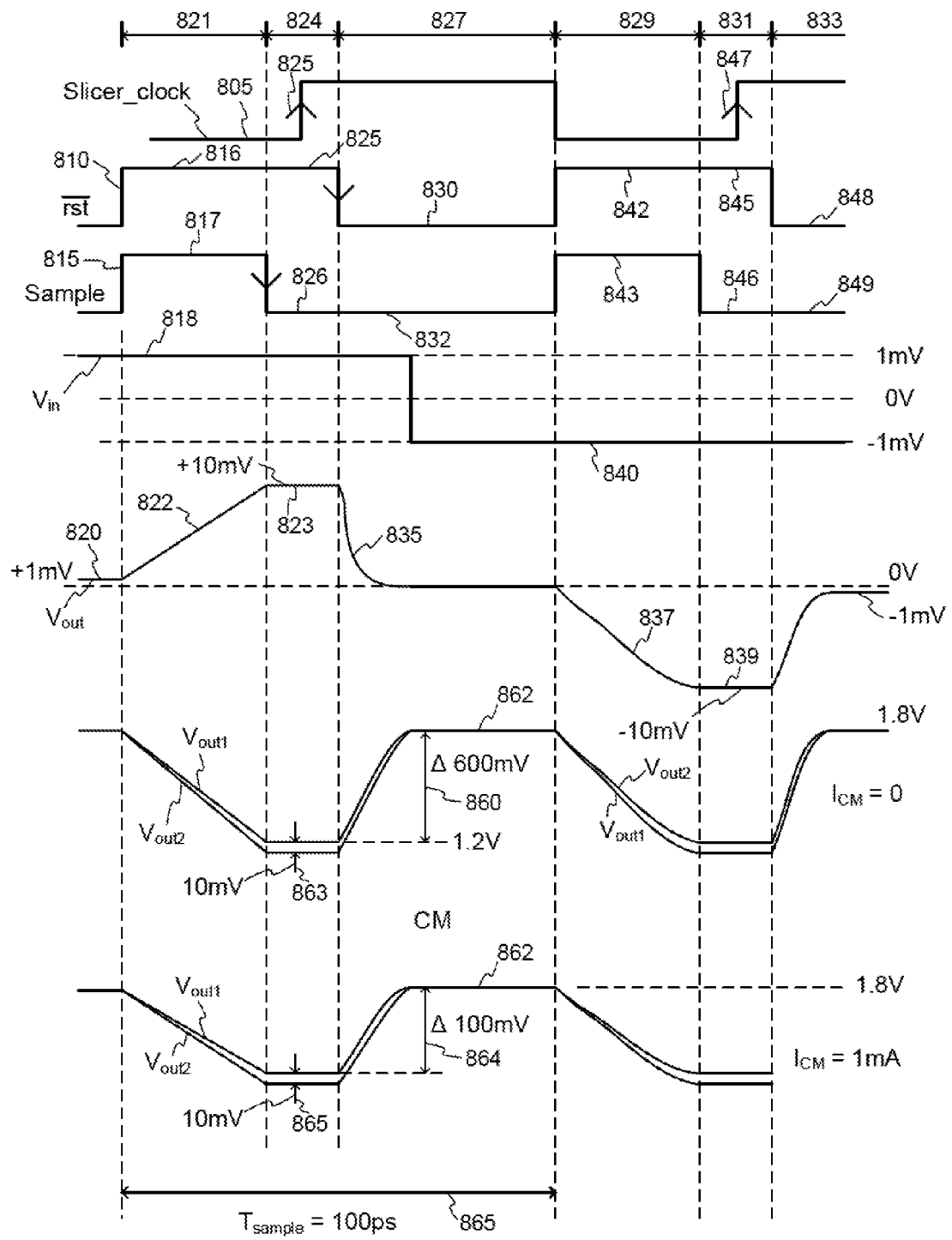
FIG. 8 are waveform diagrams of signals relating to the communication block of FIG. 7.

FIG. 8 are waveform diagrams of signals relating to the communication block 705 of FIG. 7, in accordance with an embodiment of the disclosure. For purposes of clarity, the voltage values shown in FIG. 8 are not necessarily drawn to exact scale.

A slicer clock 805 corresponds to a sampling clock of the slicer 145 (FIG. 1) that receives the output voltage 7-120 of the communication block 705. A reset signal waveform 810 ("$\overline{\text{rst}}$") corresponds to the reset signal 7-214 (FIG. 7, "rst_not"). A sample signal waveform 815 corresponds to the sample signal 7-760 (FIG. 7).

During a first time interval 821, the reset signal waveform 810 is high at a waveform portion 816 and the sample signal waveform 815 is also high at a waveform portion 817. Accordingly, the first reset active device 7-330 and the second reset active device 7-340 are turned off, while the first sampling switch 7-711 and the sampling second switch 7-712 are turned on. As a result, the first load capacitance 7-352 and the second load capacitance 7-354 are connected to the first active device 7-305 and the second active device 7-315 of the equalizer 7-209 via the first sampling switch 7-711 and the second sampling switch 7-712, respectively. Because the input voltage $V_{in}$ (i.e., $V_{in2}-V_{in1}$) is high during the first time interval 821 (e.g., above the zero voltage reference level), the first input differential voltage $V_{in1}$ is smaller than the second input differential voltage $V_{in2}$. Therefore, the current flowing through the first sampling switch 7-711 and the first active device 7-305 is smaller than the current that flows through the second sampling switch 7-712 and the second active device 7-315. As a result, the first output differential voltage $V_{out1}$ is being decreased at a slower rate than the second output differential voltage $V_{out2}$. Therefore, a waveform (or output signal waveform) 820 representing the output voltage $V_{out}$ (i.e., $V_{out1}-V_{out2}$) increases along a waveform portion 822.

During a second time interval 824, the reset signal waveform 810 is high at a waveform portion 825 and the sample signal waveform 815 is low at a waveform portion 826. Since the reset signal waveform 810 is high, the first and second reset active devices 7-330 and 7-340 remain turned off. Since the sample signal waveform 815 is low at the waveform portion 826, the sampler block 7-174 disconnects the first and second output differential voltage paths 7-218 and 7-219 from the equalizer 7-209. As a result, the first and second output differential voltages $V_{out1}$ and $V_{out2}$ each remains at its respective substantially same level during the second time interval 824. Thus, the output voltage $V_{out}$ is held at its substantially same level 823 (e.g., 10 mV). In an embodiment, at least one comparator connected to the output 7-208 of the communication block 705 is clocked by the clock edge 825 of the slicer clock 805 during the second time interval 824. The comparator may be, for example, a component in the slicer 145 shown in FIG. 1.

During a third time interval 827 after the second time interval 824, the reset signal waveform 810 goes low at a waveform portion 830 and the sample signal waveform 815 remains low at a waveform portion 832. Therefore, the first and second reset active devices 7-330 and 7-340 are turned on and the first and second sampler switches 7-711 and 7-712 remain off. In this case, the first and second output differential voltage paths 7-218 and 7-219 remain disconnected from the equalizer 7-209, while the output differential voltage paths 7-218 and 7-219 are connected to the reset block 7-207. Due to currents flowing through the first and second reset active devices 7-330 and 7-340, voltages across the first and second load capacitors 7-352 and 7-354 are decreased. As a result, the first and second output differential voltages $V_{out1}$ and $V_{out2}$ both increase toward the bias voltage level VDD, and the output differential voltage $V_{out}$ is decreased and then maintained at a level close to the zero level along a waveform portion 835.

Also during the third interval 827, the input signal $V_{in}$ becomes low (e.g., as shown in low waveform portion 840) and remains substantially the same during subsequent intervals 829, 831, and 833. Accordingly, the first input differential voltage $V_{in1}$ will be greater than the second input differential voltage $V_{in2}$ during subsequent time intervals 829, 831, and 833. Because the sample signal waveform 815 is low during the third time interval 827, first and second sampling switches 7-711 and 7-712 are turned off. Therefore the change in input signal $V_{in}$ does not affect $V_{out1}$ or $V_{out2}$ during the third time interval 827.

During a fourth time interval 829, the reset signal waveform 810 is high at a waveform portion 842 and the sample signal waveform 815 is also high at a waveform portion 843. Accordingly, the first and second reset active devices 7-330 and 7-340 are turned off, while the first and second sampling switches 7-711 and 7-712 are turned on. Because $V_{in1}$ is greater than $V_{in2}$, a current flowing through the first sampling switch 7-711 and the first active device 7-305 is greater than that through the second sampling switch 7-712 and the second active device 7-315. Thus, the first output differential voltage $V_{out1}$ is decreased at a faster rate than the second output differential voltage $V_{out2}$, so that the output differential voltage $V_{out}$ (i.e. $V_{out1}-V_{out2}$), decreases further along a waveform portion 837.

During a fifth interval 831, the reset signal waveform 810 is high at a waveform portion 845 and the sample signal waveform 815 is low at a waveform portion 846. As a result, the first and second output differential voltages $V_{out1}$ and $V_{out2}$ each remains at its substantially same level during the fifth time interval 831; i.e., communication block 705 "holds" $V_{out1}$ and $V_{out2}$. Thus, the output voltage $V_{out}$ (i.e. $V_{out1}-V_{out2}$) is held at its substantially same level 839 (e.g., −10 mV). In an embodiment, at least one comparator connected to the output 7-208 of the communication block 705 is clocked by the clock edge 825 of the slicer clock 805 during the fifth time interval 831.

During a sixth time interval 833, the reset signal waveform 810 is low at a waveform portion 848 and the sample signal waveform 815 is low at a waveform portion 849. As a result, the first and second output differential voltages $V_{out1}$ and $V_{out2}$ both increase toward the bias voltage level VDD, and the output voltage $V_{out}$ is increased and then maintained at a level close to the zero voltage level.

In an embodiment, the sample signal waveform 815 is held low during periods of time when the input signal 7-206 is not being received, which reduces the power dissipated by the communication block 705. During a period of time when sample signal waveform 815 is held low to reduce power dissipation, the reset signal waveform 810 may be high in order to allow the output differential voltages $V_{out1}$ and/or $V_{out2}$ to float. The reset signal waveform 810 may be low in order to pull the output differential voltages $V_{out1}$ and/or $V_{out2}$ towards the bias voltage level (e.g., towards VDD).

Figure 9:
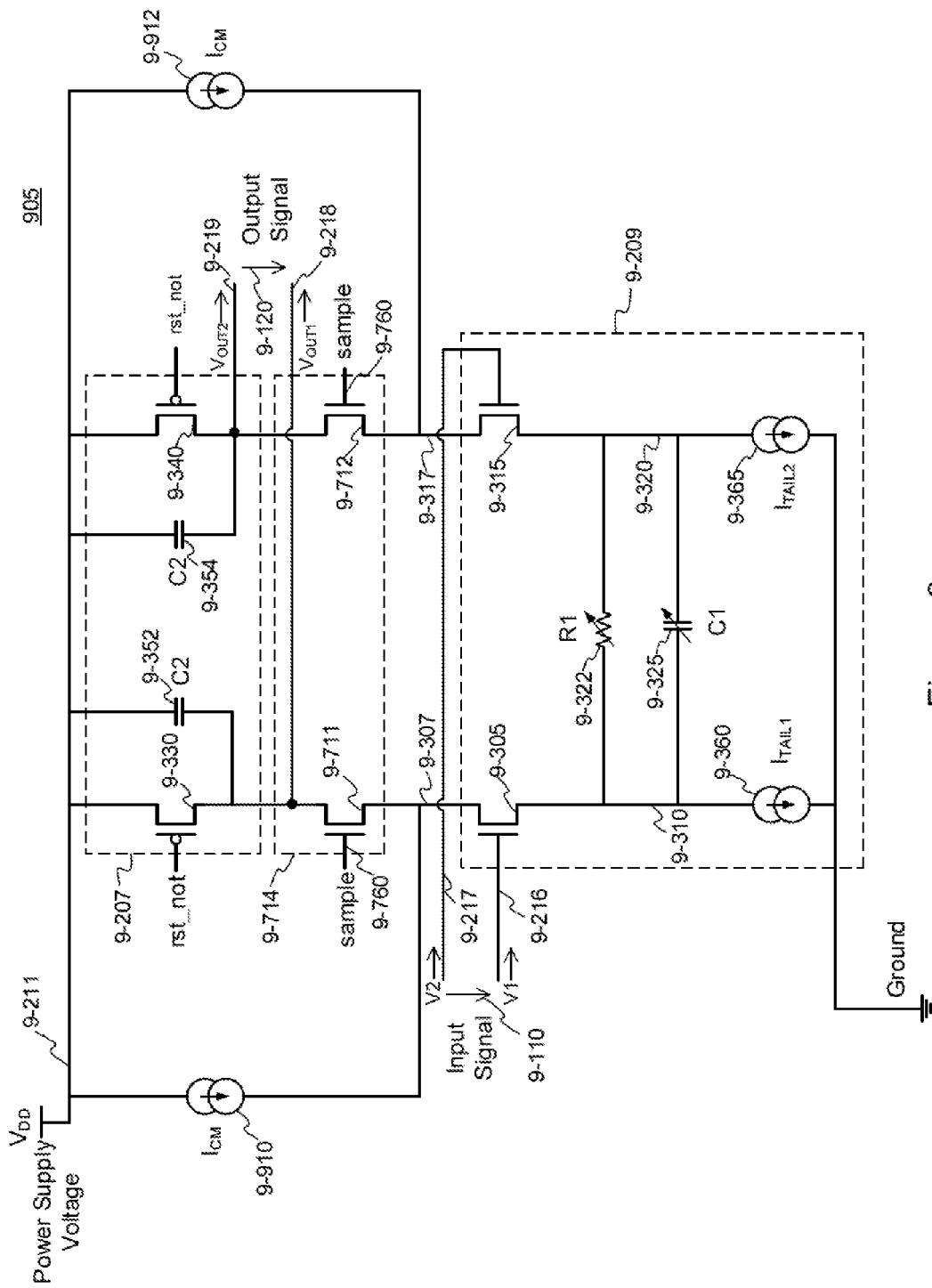
FIG. 9 is a diagram of a communication block, in accordance with an embodiment of the disclosure.

FIG. 9 is a diagram of a communication block 905, in accordance with an embodiment of the disclosure. The communication block 905 includes a reset block 9-207, an equalizer 9-209, and a sampler block 9-714 that is coupled to the reset block 9-207 and the equalizer 9-209, each with functionalities similar to the corresponding components discussed with reference to FIG. 7. The communication block 905 also includes a first current device 9-910 that is connected via electrical path 9-307 to the terminals of the active device 9-305 and the sampling switch 9-711 and a second current device 9-912 that is connected via electrical path 9-317 to the terminals of the active device 9-315 and the sampling switch 9-712. The current devices 9-910 and 9-912 are also connected via electrical path 9-211 to the power supply voltage VDD. Each of the current devices 9-910 and 9-912 is configured to provide a current to an electrical path connecting the sampler block 9-714 to the equalizer 9-209 in order to control a dynamic range of the equalizer 9-209.

Specifically, the current devices 9-910 and 9-912 each generates a programmable current $I_{CM}$ to adjust the common mode voltage shift of the output voltages $V_{out1}$ on output line 9-218 and $V_{out2}$ on output line 9-219 as shown in FIGS. 8 and 9. For example, for $I_{CM}=0$, the output voltage $V_{out1}$ will shift by an amount 860 (e.g., approximately 600 mV) from a voltage level 862 (e.g., approximately 1.8V). For $I_{CM}=1$ mA, because a current flowing through the first active device 9-305 of the equalizer 9-209 remains substantially the same, a current flowing through the first sampling switch 9-711 will be decreased by 1 mA. As a result, when $I_{CM}=1$ mA, the output voltage $V_{out1}$ will be decreased at a slower rate than the output voltage $V_{out1}$ would be if $I_{CM}=0$, and therefore the output voltage $V_{out1}$ would have a decreased shift amount 864 (e.g., approximately 100 mV) from the voltage level 862 during the same interval 821.

Similarly for $V_{out2}$, for $I_{CM}=1$ mA, since a current flowing through the second sampling switch 9-712 will be decreased, the output voltage $V_{out2}$ will be decreased at a slower rate than the output voltage $V_{out2}$ for $I_{CM}=0$, and thus have a decreased shift.

When, as shown, the current flowing through the first sampling switch 9-711 and the current flowing through the second sampling switch 9-712 are decreased by approximately the same amount of the programmable current $I_{CM}$, the difference between the two currents remains substantially the same as that for $I_{CM}=0$. As a result, the difference (e.g., a differential voltage amount 865) between the output voltages $V_{out1}$ and $V_{out2}$ for $I_{CM}=1$ mA will remain substantially the same as the difference (e.g., a differential voltage amount 863) for $I_{CM}=0$. On the other hand, the common mode voltage shift of the output voltages $V_{out1}$ and $V_{out2}$ for $I_{CM}=1$ mA is less than the common voltage mode shift for $I_{CM}=0$, and therefore the common mode voltage of $V_{out1}$ and $V_{out2}$ for $I_{CM}=1$ mA becomes greater than the common mode voltage for $I_{CM}=0$.

In this manner, the value of the programmable current $I_{CM}$ permits control of the output common mode voltage. Because the use of the current $I_{CM}$ as described above allows the common mode output voltage of $V_{out1}$ and $V_{out2}$ to be reduced without reducing the output signal 9-120 comprising the differential output voltage between $V_{out1}$ and $V_{out2}$, the dynamic range of the communication block 905 is improved.

Figure 10:
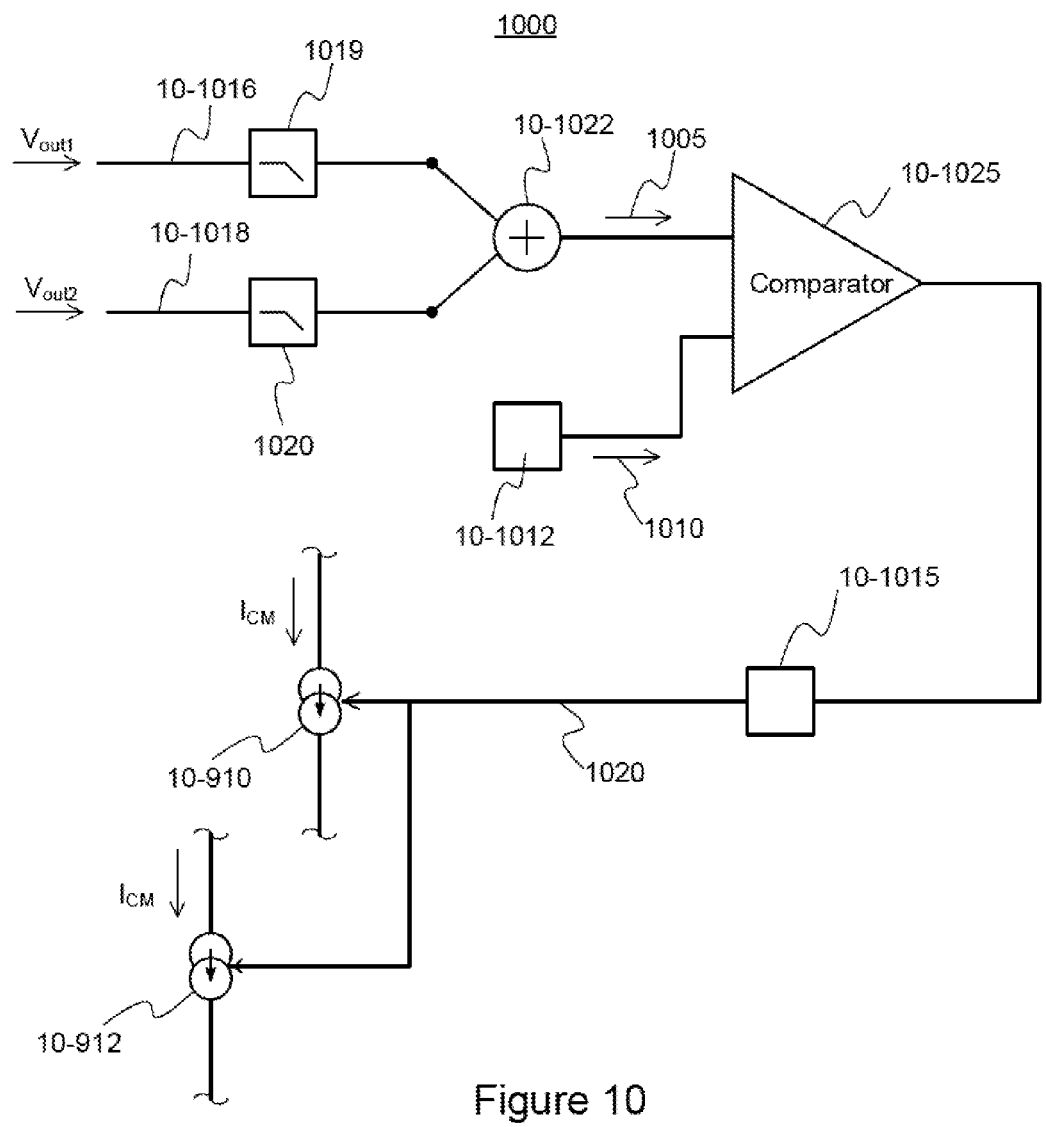
FIG. 10 is a block diagram of a feedback circuit that is connected to the current device of FIG. 9, in accordance with an embodiment of the disclosure.

FIG. 10 is a block diagram of a feedback circuit 1000 that is connected to first and second current devices 10-910 and 10-912, in accordance with an embodiment of the disclosure. The current devices 10-910 and 10-912 of FIG. 10 corresponds to the current devices 9-910 and 9-912 connected to the sampling switches 9-711 and 9-712, respectively, in the sampler block 9-714 of FIG. 9. In an embodiment, the first current device 10-910 and the second current device 10-912 react in a substantially identically manner to the control signal 1020.

During initial calibration of the communication block 905, the values of the output differential voltage signal 9-120 are detected by the feedback circuit 1000 during a sample time ($T_{sample}$) (FIG. 8). The sample time ($T_{sample}$) may be set to a suitable value such as, for example, approximately 100 ps.

The feedback circuit 1000 receives the first output differential voltage $V_{out1}$ via a first input electrical path 10-1016 of the feedback circuit 1000 and receives the second output differential voltage $V_{out2}$ via a second input electrical path 10-1018 of the circuit 1000. The voltages $V_{out1}$ and $V_{out2}$ are filtered by the low pass filters 1019 and 1020, respectively. The cut off frequency of each of the low pass filters 1019 and 1020 may be substantially below the switching frequency of the sampler block 9-714 and the reset block 9-207 of FIG. 9. The cutoff frequency is chosen such that the fluctuations in the voltages $V_{out1}$ and $V_{out2}$ that are caused by the switching within the sampler block 9-714 and the reset block 9-207 are reduced by a sufficient amount (e.g., by 6, 12, or 20 or more decibels) so as to not interfere with the proper operation of feedback circuit 1000.

The feedback circuit 1000 includes a calculation block 10-1022 that is configured to determine an average value 1005 of a plurality of values of the output voltages $V_{out1}$ and $V_{out2}$. The feedback circuit 1000 also includes a comparator 10-1025 connected to the calculation block 10-1022. The comparator 10-1025 is configured to compare the average value 1005 with a reference voltage value 1010 from a reference voltage source 10-1012. In an embodiment, the comparator 10-1025 may include a differential amplifier. In an embodiment, the reference voltage source 10-1012 may provide a configurable reference voltage.

The feedback circuit 1000 also includes a control block 10-1015 connected to the comparator 10-1025. The control block 10-1015 is configured to generate a control signal 1020 to control the value of the current $I_{CM}$ generated by the current devices 10-910 and 10-912 based on an output of the comparator 10-1025. For example, if the average value 1005 representing the common mode of the output voltages $V_{out1}$ and $V_{out2}$ is greater than the reference voltage value 1010, the control block 10-1015 controls the current devices 10-910 and 10-912 to decrease the value of the current $I_{CM}$, thereby decreasing the common mode component of the output voltages $V_{out1}$ and $V_{out2}$. In an embodiment the control block 10-1015 is a digital control block. The digital control block can include one or more of a processor, finite state machine, digital logic, digital-to-analog converter, and/or analog-to-digital converter. The output of the comparator 10-1025 (or control signal 1020) can be used in an analog common mode loop feedback or used in a digital assisted output common mode calibration scheme.

Figure 11:
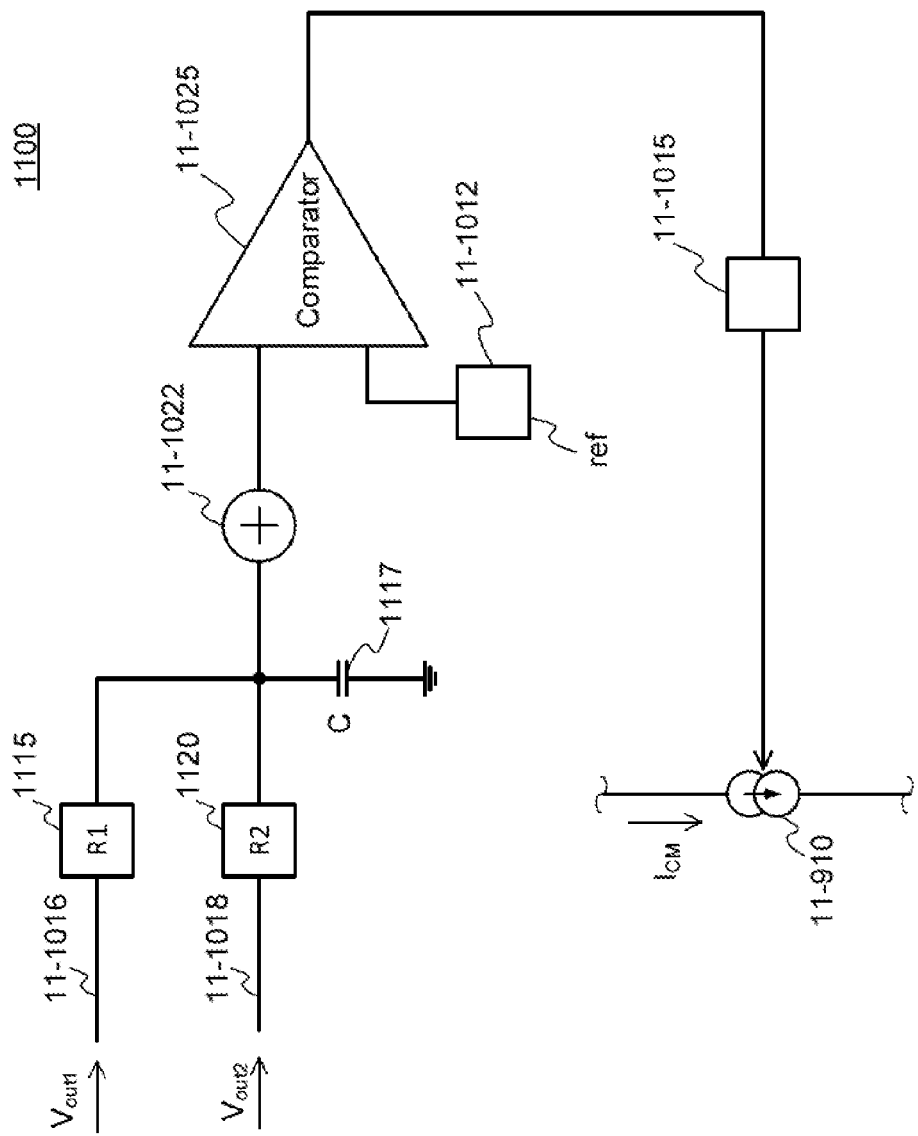
FIG. 11 is a block diagram of a feedback circuit, in accordance with an embodiment of the disclosure.

FIG. 11 is a block diagram of a feedback circuit 1100 that is connected to a current device 11-910, in accordance with an embodiment of the disclosure. The feedback circuit 1100 includes at least some similar components as the feedback circuit 1000 of FIG. 10. In an embodiment, feedback circuit 1100 includes a second current device (not shown) corresponding to second current device 10-912 of FIG. 10.

The feedback circuit 1100 receives the first output differential voltage $V_{out1}$ via a first input electrical path 11-1016 of the feedback circuit 1100 and receives the second output differential voltage $V_{out2}$ via a second input electrical path 11-1018 of the circuit 1100. The voltage $V_{out1}$ is filtered by the low pass filter formed by a resistor 1115 and a capacitor 1117, and the voltage $V_{out2}$ is filtered by the low pass filter formed by a resistor 1120 and a capacitor 1117.

The cut off frequency of each of these low pass filters is substantially below the switching frequency of the sampler block 9-714 and the reset block 9-207 of FIG. 9. Because the cut-off frequencies of the low pass filters are inversely proportional to the resistance values of the resistors 1115 and 1120, the resistance values are sufficiently high (e.g., 100 KΩ) to make the cut-off frequencies below the switching frequency. The capacitance value of the capacitor 1117 is determined based on a desired value of the cut-off frequency.

Figure 12:
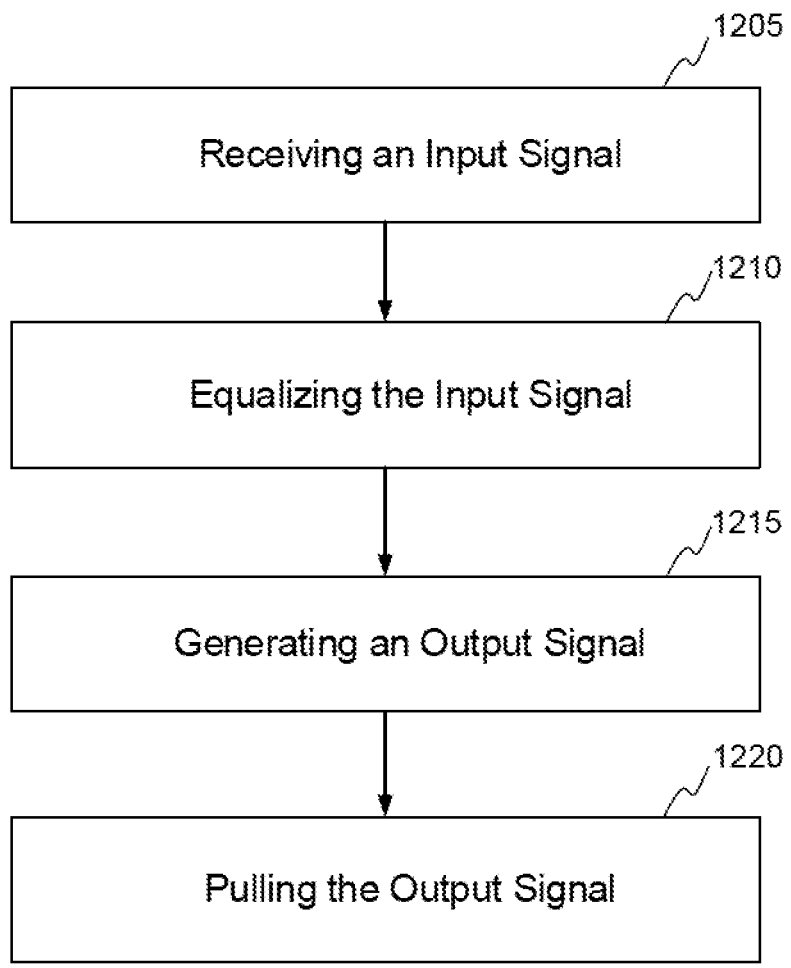
FIG. 12 is a flow diagram of a method of receiving a signal, in accordance with an embodiment of the disclosure.

FIG. 12 is a flow diagram of a method 1200, in accordance with an embodiment of the disclosure. The method 1200 may be used to perform equalization of a communication signal in order to compensate for channel frequency attenuation that may occur in the communication signal.

At 1205, an input signal at an input is received at a device which produces an output signal. The input signal can be a single-ended signal or a differential signal comprising first and second complementary input signals.

At 1210, the input signal having attenuated high frequency components is equalized. High frequency components of the input signal are amplified with higher gains than low frequency components of the input signal.

At 1215, an output signal is generated based on the equalized input signal. The output signal can be a single-ended signal or a differential signal comprising first and second complementary output signals, independent of the input signal type received. The output signal of the device is changed according to the input signal. The output signal may be changed according to other parameters, for instance, the bias level pulled by the reset block (e.g., 3-207 in FIG. 3), and resistance and/or capacitance values of the load resistors (e.g., 350 and 353 in FIG. 3) and capacitors (e.g., 3-352 and 3-354 in FIG. 3) in the reset block.

At 1220, the output signal of the device is pulled towards a bias level based on a reset signal applied to a reset block. The bias level can be a voltage. In an embodiment, the output signal is a differential signal and the reset signal pulls both the first and second complementary output signals of the output signal towards the same value so that the difference between the first and second complementary output signals is pulled towards zero.

Figure 13:
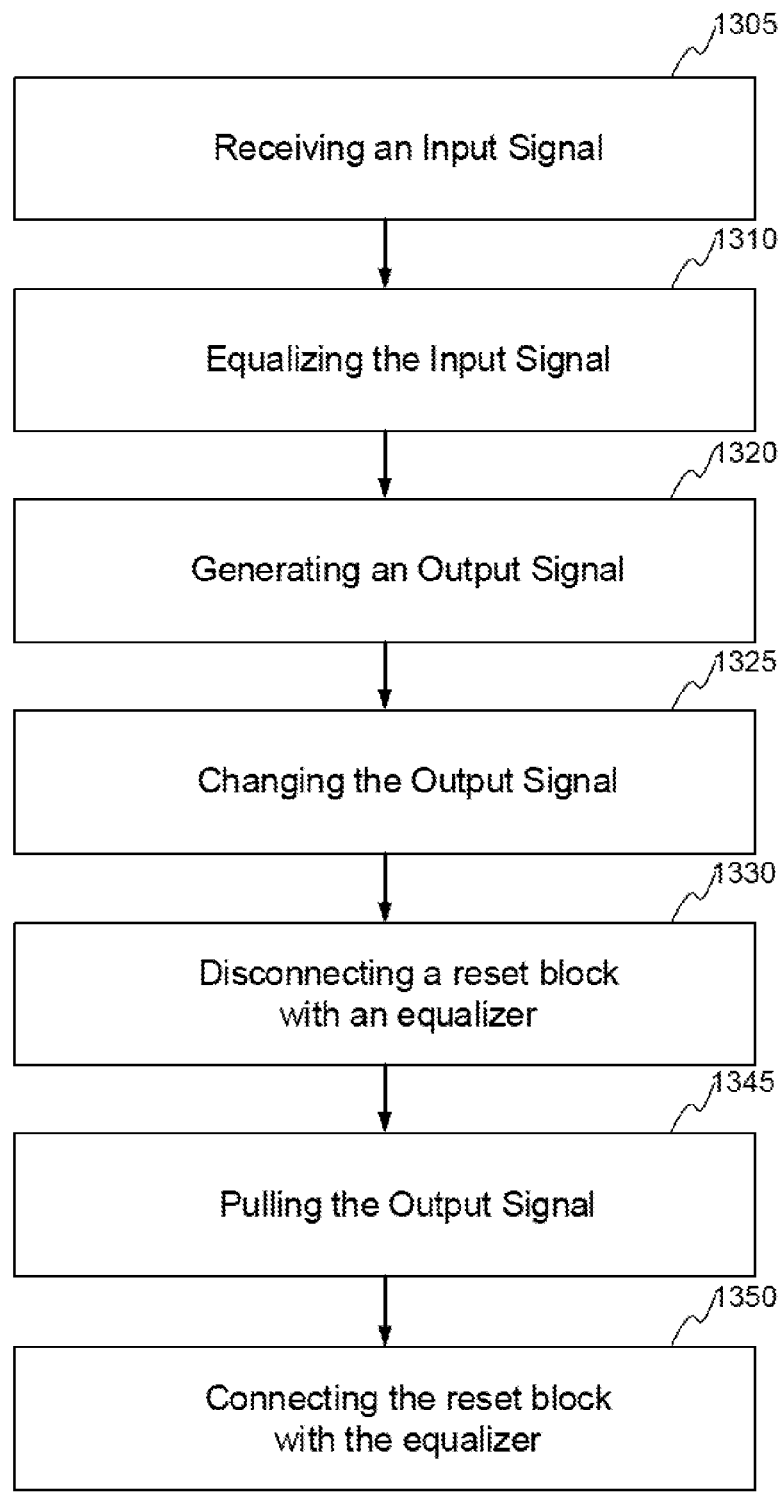
FIG. 13 is a flow diagram of a method of receiving and sampling a signal, in accordance with an embodiment of the disclosure.

FIG. 13 is a flow diagram of a method 1300, in accordance with an embodiment of the disclosure. The method 1300 may be used to perform equalization of a communication signal in order to compensate for channel frequency attenuation that may occur in the communication signal and to sample and hold the result of the equalization.

At 1305, an input signal at an input is received at a device which produces an output signal. The input signal can be a single-ended signal or a differential signal comprising first and second complementary input signals.

At 1310, the input signal having attenuated high frequency components is equalized. Specifically, these high frequency components of the input signal are amplified with higher gains than low frequency components of the input signal.

At 1320, an output signal is generated based on the equalized input signal. The output signal can be a single-ended signal or a differential signal comprising first and second complementary output signals, independent of the input signal type received.

At 1325, the output signal of the device is changed according to the input signal. The output signal may be changed according to other parameters, for instance, the bias level pulled by the reset block, and resistance and/or capacitance values of the load resistors (e.g., 350 and 353 in FIG. 3) and capacitors (e.g., 7-352 and 7-354 in FIG. 7) in the reset block.

At 1330, a sampler block disconnects a reset block (e.g., 7-207 in FIG. 7) from a part (e.g., equalizer 7-209 in FIG. 7) of the device capable of changing the output signal according to the input signal. For example, the sampler block disconnects the output signal from the equalizer to prevent or substantially prevent further changes in the output signal while it is activated; i.e., the sampler block holds the output signal.

At 1345, the output signal of the device is pulled towards a bias level by a reset block. The bias level can be a voltage. In an embodiment, the output signal is a differential signal and the reset signal pulls both the first and second complementary output signals of the output signal towards the same value so that the difference between the first and second complementary output signals is pulled towards zero.

At 1350, the sampler block connects the reset block with a part (e.g., equalizer 7-209 in FIG. 7) of the device capable of changing the output signal according to the input signal. For example, the sampler block reconnects the output signal to the equalizer to allow the device to change the output signal as described at 1325. In an embodiment, 1350 follows 1345 by an interval sufficient to allow a further processing of the output signal. In an embodiment, the further processing of the output signal is slicing. In an embodiment, the further processing of the output signal is an analog-to-digital conversion.

Figure 14:
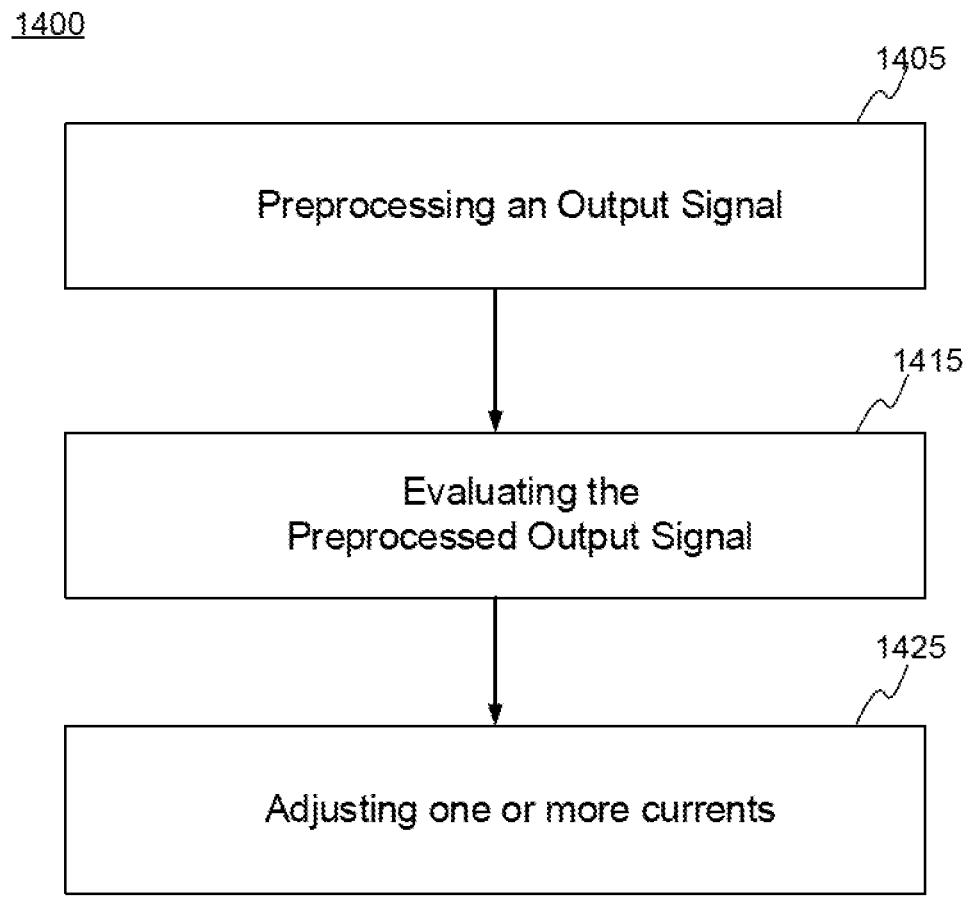
FIG. 14 is a flow diagram of a method of adjusting a voltage component of an output signal, in accordance with an embodiment of the disclosure.

FIG. 14 is a flow diagram of a method 1400 for controlling a voltage component of an output signal of a device, in accordance with an embodiment of the disclosure. In an embodiment, the device is a communication block comprising an equalizer. In an embodiment, the voltage component of the output signal being controlled is an output bias voltage. In an embodiment, the voltage component of the output signal being controlled is a common mode voltage of a differential output signal. The method 1400 may be used in an analog common mode loop feedback or used in a digital assisted output common mode calibration scheme.

At 1405, an output signal of a device is preprocessed to support a subsequent evaluation. The preprocessing includes filtering the output signal to produce a filtered voltage signal. In an embodiment, the output is a differential output comprising first and second differential signals, each of the first and second differential signals is filtered to produce first and second filtered differential voltage signals, and the first and second filtered differential signals are averaged together to produce the filtered voltage signal. In another embodiment, the first and second differential voltage signals are averaged together and the averaged signal is filtered to produce the filtered voltage signal. The filtering is performed at a cut off frequency substantially below a switching frequency of the device.

The preprocessing of 1405 further includes averaging together a plurality of filtered output values to produce the preprocessed output signal.

At 1415, the preprocessed output signal produced by 1405 is evaluated to determine whether the component of the output voltage being controlled should be adjusted. Evaluating the preprocessed output signal may include comparing the preprocessed output signal to a reference voltage.

At 1425, based on the evaluation of the preprocessed output performed at 1415, one or more currents provided to the device may be adjusted. In an embodiment, the currents provided are controlled by a digital control block. In an embodiment, the one or more currents provided to the device include first and second provided currents wherein the first provided current is the same as the second provided current, and the first and second provided currents are provided to an output terminal of first and second active devices configured to operate as a differential pair, respectively.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus, comprising:
    an input;
    an output;
    an equalizer configured to receive an input signal at the input and to equalize the input signal to generate an output signal for the output;
    a reset block coupled to the equalizer and the output and configured to pull the output signal at the output toward a bias voltage level based on a reset signal; and
    a sampler block coupled to the reset block and the equalizer,
    wherein the sampler block is configured to connect and disconnect the reset block with the equalizer in response to a sample signal, and
    wherein the output is provided between the reset block and the sampler block.

2. The apparatus of claim 1, wherein a first sampling switch of the sampler block is configured to connect and disconnect a first reset switch of the reset block with the equalizer and a second sampling switch of the sampler block is configured to connect and disconnect a second reset switch of the reset block with the equalizer.

3. The apparatus of claim 2, wherein the first sampling switch and the second sampling switch alternatively connect and disconnect a respective first or second reset switch of the reset block with the equalizer.

4. The apparatus of claim 1, wherein the sampler block comprises a first switch and a second switch,
    wherein first terminals of the first switch and the second switch are connected to the equalizer, and
    wherein second terminals of the first switch and the second switch are connected to the output.

5. The apparatus of claim 1, wherein the equalizer is configured to amplify different frequency components of the input signal with different gains to produce the output signal.

6. The apparatus of claim 1, wherein the reset block comprises a first switch having first and second switched terminals connected across a first capacitance and a second switch having first and second switched terminals connected across a second capacitance.

7. The apparatus of claim 6, wherein the capacitors comprise parasitic capacitance, and
    wherein the output is coupled to first and second output nodes of the equalizer.

8. The apparatus of claim 6, further comprising a first resistor connected across the first and second switched terminals of the first switch and a second resistor connected across the first and second switched terminals of the second switch.

9. The apparatus of claim 1, further comprising:
    a current device configured to control a current flowing through the sampler block in order to control a dynamic range of the equalizer.

10. The apparatus of claim 9, wherein the current device comprises:
    a low pass filter connected to the output and configured to filter the output signal with a cut-off frequency that is below switching frequencies of the reset signal and the sample signal;
    a calculation block configured to determine an average value of a plurality of values of the output signal;
    a comparator connected to the calculation block and configured to compare the average value with a reference voltage value; and
    a control block connected to the comparator and configured to generate a control signal to control the current device based on an output of the comparator.

11. The apparatus of claim 1, wherein the input signal comprises a differential input signal and the output signal comprises a differential output signal.

12. The apparatus of claim 1, wherein the output signal is maintained at a substantially constant level when the sampler block disconnects the reset block with the equalizer.

13. A method, comprising:
    receiving an input signal;
    equalizing the input signal by an equalizer;
    generating an output signal based on the equalized input signal;
    pulling the output signal towards a bias voltage level based on a reset signal by a reset block; and
    connecting and disconnecting the reset block with the equalizer by a sampler block in response to a sample signal,
    wherein the sampler block is coupled to the reset block and the equalizer.

14. The method of claim 13, wherein pulling the output signal towards the bias voltage level includes connecting the output signal with a bias voltage source if the reset signal is asserted, the method further comprising:
    changing the output signal according to the equalized input signal if the reset signal is de-asserted.

15. The method of claim 14, wherein connecting and disconnecting the reset block with the equalizer includes:
    connecting and disconnecting a first reset switch of the reset block with the equalizer; and
    connecting and disconnecting a second reset switch of the reset block with the equalizer.

16. The method of claim 15, further comprising:
    alternatively connecting and disconnecting the first reset switch or the second reset switch of the reset block with the equalizer.

17. The method of claim 13, wherein equalizing the input signal includes amplifying different frequency components of the input signal with different gains to produce the output signal.

18. The method of claim 14, further comprising:
    controlling a current before sampling of the input signal to control a dynamic range of amplification of the input signal.

19. The method of claim 18, the controlling the current before sampling of the input signal comprises:
    determining an average value of a plurality of values of the output signal;
    comparing the average value with a reference voltage value; and
    generating a control signal to control the current.

20. The method of claim 13, wherein the input signal comprises a differential input signal and the output signal comprises a differential output signal.

21. An apparatus comprising:
    an input;
    an output;
    an equalizer configured to receive an input signal at the input and to generate an output signal for the output;
    a low pass filter coupled to the output of a communication block, the low pass filter having a cut off frequency substantially below a switching frequency of the communication block;
    a calculation block configured to determine an average value of a plurality of values of the output signal;
    a differential amplifier having a first input coupled to the calculation block and a second input coupled to a reference voltage source; and a control block connected to the differential amplifier and configured to generate a control signal to control a current device based on an output of the differential amplifier, wherein the output of the differential amplifier is used as an indicator to detect whether an output common mode voltage of the communication block is below or above a reference voltage generated by the reference voltage source.

22. The apparatus of claim 21, wherein the output of the differential amplifier is used to control the output common mode voltage of the output of the communication block.

23. The apparatus of claim 21, wherein the low pass filter includes a first resistor, a second resistor, and a capacitor, wherein the first and second resistors are connected to each other in parallel, and wherein the capacitor is connected to terminals of the first and second resistors.

\* \* \* \* \*